US009231064B1

(12) United States Patent
Reza et al.

(10) Patent No.: US 9,231,064 B1
(45) Date of Patent: Jan. 5, 2016

(54) DOUBLE HETEROJUNCTION GROUP III-NITRIDE STRUCTURES

(71) Applicant: Raytheon Company, Waltham, MA (US)

(72) Inventors: Shahed Reza, Boxborough, MA (US); Eduardo M. Chumbes, Andover, MA (US); Thomas E. Kazior, Sudbury, MA (US); Gerhard Sollner, Winchester, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 14/457,436

(22) Filed: Aug. 12, 2014

(51) Int. Cl.
| H01L 29/778 | (2006.01) |
| H01L 29/66 | (2006.01) |
| H01L 21/335 | (2006.01) |
| H01L 29/36 | (2006.01) |
| H01L 29/205 | (2006.01) |
| H01L 29/20 | (2006.01) |
| H01L 21/265 | (2006.01) |

(52) U.S. Cl.
CPC ............ *H01L 29/36* (2013.01); *H01L 21/2654* (2013.01); *H01L 29/2003* (2013.01); *H01L 29/205* (2013.01); *H01L 29/66462* (2013.01); *H01L 29/7784* (2013.01); *H01L 29/7786* (2013.01); *H01L 29/7787* (2013.01); *H01L 29/7788* (2013.01); *H01L 29/7789* (2013.01)

(58) Field of Classification Search
CPC ............ H01L 29/66462; H01L 29/205; H01L 29/7786–29/7789
USPC ........... 257/194, E29.246, E29.251, E21.408; 438/172
See application file for complete search history.

(56) References Cited

U.S. PATENT DOCUMENTS

| 5,488,237 | A * | 1/1996 | Kuwata | H01L 29/7785 257/192 |
| 7,098,490 | B2 | 8/2006 | Micovic et al. | |
| 2003/0020136 | A1* | 1/2003 | Kitabatake | H01L 29/7828 257/502 |
| 2003/0178633 | A1 | 9/2003 | Flynn et al. | |
| 2004/0238842 | A1 | 12/2004 | Micovic et al. | |
| 2005/0133816 | A1* | 6/2005 | Fan | H01L 29/7783 257/190 |
| 2006/0226442 | A1* | 10/2006 | Zhang | H01L 29/7787 257/192 |
| 2006/0244010 | A1* | 11/2006 | Saxler | H01L 29/7783 257/194 |
| 2007/0131970 | A1* | 6/2007 | Mittereder | H01L 29/66462 257/194 |

(Continued)

FOREIGN PATENT DOCUMENTS

EP          1 488 460 B1     12/2004

OTHER PUBLICATIONS

Lee et al.; "Enhanced Electrical Characteristics of AtGaN/GaN Heterestucture Field-Effect Transistor with p—GaN Back Barriers and Si Delta-Doped Layer", Japanese Journal of Applied Physics, vol. 47, No. 4, Apr. 25, 2008, 4 pages.*

(Continued)

*Primary Examiner* — Marvin Payen
*Assistant Examiner* — Jeremy Joy
(74) *Attorney, Agent, or Firm* — Daly, Crowley, Mofford & Durkee, LLP

(57) ABSTRACT

A semiconductor structure having: a Group III-N channel layer, a Group III-N top-barrier polarization-generating layer forming a heterojunction with an upper surface of the channel layer; and a Group III-N back-barrier polarization-generating layer forming a heterojunction with a lower surface of the channel layer. The channel layer has disposed therein a predetermined n-type conductive dopant.

27 Claims, 3 Drawing Sheets

(56) References Cited

U.S. PATENT DOCUMENTS

| | | | | |
|---|---|---|---|---|
| 2008/0258125 | A1* | 10/2008 | Liu et al. | 257/2 |
| 2008/0258135 | A1* | 10/2008 | Hoke | H01L 29/201 257/23 |
| 2010/0084687 | A1* | 4/2010 | Chen | H01L 29/207 257/194 |
| 2010/0327322 | A1* | 12/2010 | Kub | H01L 29/0847 257/194 |
| 2014/0264379 | A1* | 9/2014 | Kub | H01L 29/41725 257/77 |

OTHER PUBLICATIONS

Miroslav Micovic, Paul Hashimoto, Ming Hu, Ivan Milosavljevic, Janna Duvall, Peter J. Willadsen, W.S. Wong, Adam M. Conway, Ara Kurdoghlian, Peter W. Deelman, Jeong-S. Moon, Adele Schmitz, Michael J. Delaney, GaN Double Heterojunction Field Effect Transistor for Microwave and Millimeterwave Power Applications, HRL Laboratories, LLC, IEEE 2004, pp. 33.4.1-33.4.4.

T. Palacios, A. Chakraborty, S. Heikman, S. Keller, S.P. Denbaars, U.K. Mishra, AlGaN/GaN High Electron Mobility Transistors with InGaN Back-Barriers, IEEE, Jan. 2006, vol. 27, No. 1, pp. 13-15.

Lee at al.; "Enhanced Electrical Characteristics of AlGaN/GaN Heterostructure Field-Effect Transistor with p-GaN sack Barriers and Si Delta-Doped Layer", Japanese Journal of Applied Physics, vol. 47, No. 4, Apr. 25, 2008, 4 pages.

Palacios et al.; "AlGaN/GaN High Electron Mobility Transistors with InGaN Back-Barriers," IEEE Electron Device Letters, vol. 27, No. 1, Jan. 2008, 3 pages.

PCT Notification of Transmittal of the international Search Report and the Written Opinion of the International Searching Authority, or the Declaration dated Aug. 3, 2015, 1 page.

PCT International Search Report dated Aug. 3, 2015, 4 pages.

PCT Written Opinion of the International Searching Authority dated Aug. 3, 2015, 5 pages.

* cited by examiner

DOUBLE HETEROJUNCTION GROUP III-NITRIDE STRUCTURES

TECHNICAL FIELD

This disclosure relates generally to heterojunction semiconductor structures and more particularly to double heterojunction Group III-Nitride (Group III-N) structures.

BACKGROUND

As is known in the art, a double heterojunction (DH) Gallium Nitride (GaN) High Electron Mobility Transistor (DH-HEMT) has a back-barrier providing charge confinement in the gate channel thereby improving gate control resulting in lowering off-state conduction and allowing for improved gain performance at higher voltage operation. See for example, an article entitled AlGaN Barrier/GaN channel/InGaN Back-barrier/GaN Buffer, T. Palacios, A. Chakraborty, S. Heikman, S. Keller, S. P. DenBaars, and U. K. Mishra, IEEE Electron Device Letters Vol. 27, 2006, pp. 13-15.

Typically this back barrier consists of an Aluminum Gallium Nitride (AlGaN) layer with relatively low Aluminum (Al) mole-fraction (typically 3%~8%). However, because of polarization, the channel charge (also called 2 Dimensional Electron Gas or 2-DEG) in the DH-HEMT is lower compared to a comparable HEMT structure without back-barrier, thereby impacting maximum current. To compensate for the reduced 2-DEG and current, the Al mole-fraction and/or the thickness of the top-barrier layer is increased. However, this brings several drawbacks including increased strain in the semiconductor structure leading to performance degradation.

SUMMARY

In accordance with the present disclosure, a semiconductor structure is provided: a III-N channel layer; a III-N top-barrier polarization-generating layer forming a heterojunction with an upper surface of the channel layer; and a III-N back-barrier polarization-generating layer forming a heterojunction with a lower surface of the channel layer. The Group III-N channel layer has disposed therein a predetermined n-type conductive dopant.

The use of a doped channel layer has been demonstrated to recover the 2-DEG charge density reduction due to the addition of a back-barrier layer. The doping of the channel of the AlGaN/GaN DH-HEMT structure compensates for the reduction of 2-DEG due to the back-barrier layer.

The inventors have recognized that by doping the GaN channel below the 2-DEG, the channel charge and thereby the current in the HEMT can be recovered in a DH-HEMT having a back-barrier structure without any composition and thickness modification of the top-barrier polarization-generating layer above the channel. Physics-based computer simulations were used to determine the level of doping required in the channel to recover the charge. This doping is disposed in the channel layer and displaced from the interface between channel layer and the top-barrier layer, to avoid scattering of charges in the 2-DEG. Preferably, the doping is confined to a narrow region using a technique called delta (δ) doping.

In one embodiment, the channel dopant is a delta-doped region having a peak concentration at a predetermined distance from the upper surface of the channel layer.

In one embodiment, the peak doping concentration is in a range of $1 \times 10^{12}/cm^2$ to $2 \times 10^{13}/cm^2$.

In one embodiment, the peak doping concentration of the delta-doped region is at a predetermined position in the channel layer, the position being in a range, R, extending from a predetermined distance, D1, above a lower surface of the III-N channel layer to a predetermined distance, D2, below an upper surface of the III-N channel layer.

In one embodiment, the delta-doped region has a width δ where δ is 1-3 atomic layers (<2 nm).

In one embodiment, the channel layer is GaN, the top-barrier polarization-generating layer is AlGaN having an Al mole concentration in a range of 20-35%, and the back-barrier polarization-generating layer is AlGaN having an Al mole concentration in a range of 3-8%.

In one embodiment, the top-barrier polarization-generating layer has a thickness in a range of 15-30 nm and the back-barrier polarization-generating layer has a thickness greater than 20 nm.

In one embodiment, the channel layer is n-type doped GaN having a thickness in a range of 10-50 nm.

In one embodiment, a source electrode is over a first surface portion of the structure, a drain electrode is over a second surface portion of the structure; and a gate electrode is over a third portion of the structure, the gate electrode controlling a flow of carriers between the source electrode and the drain electrode through the channel layer.

In one embodiment, a semiconductor structure is provided having: an n-doped GaN channel layer; a first AlGaN layer forming a heterojunction with an upper surface of the channel layer; and a second AlGaN layer forming a heterojunction with a lower surface of the channel layer.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

Like reference symbols in the various drawings indicate like elements.

DETAILED DESCRIPTION

Figure 1:
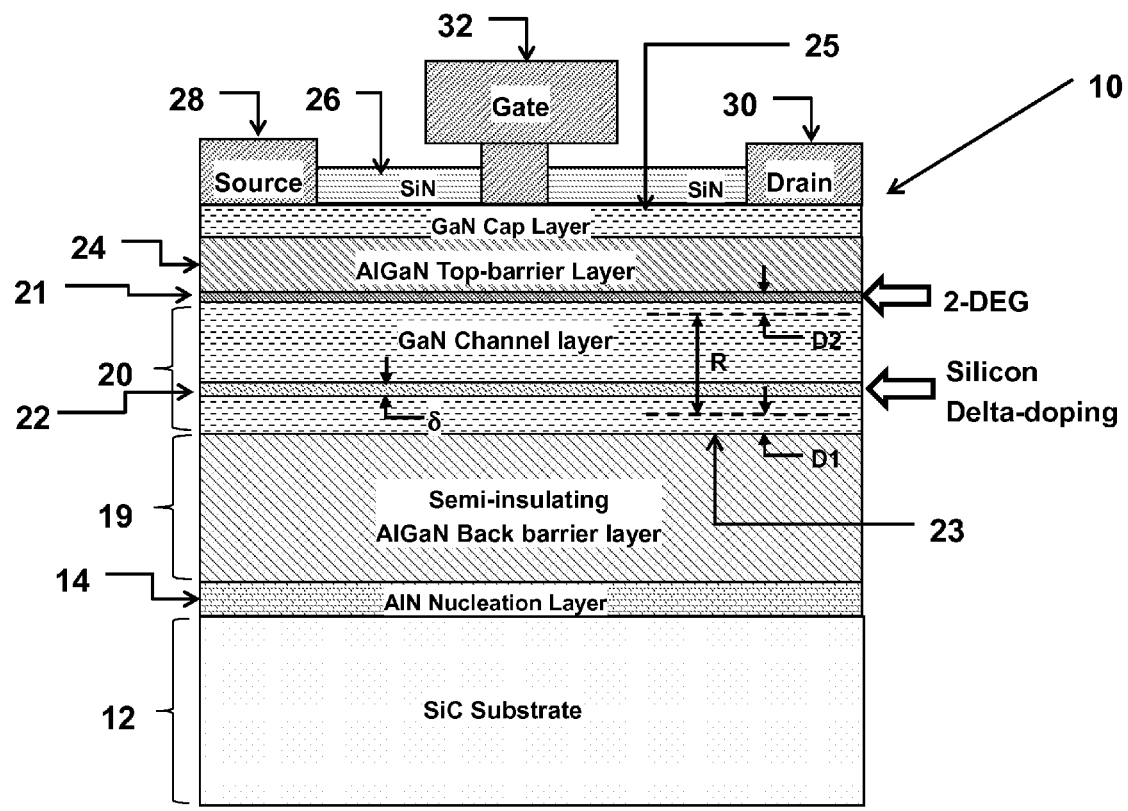
FIG. 1 is a simplified cross-sectional sketch of a double heterojunction (DH) Gallium Nitride (GaN) High Electron Mobility Transistor (DH-HEMT) with a delta-doped channel layer according to the disclosure.

Referring now to FIG. 1, a double heterojunction (DH) Group III-N, here, for example, Gallium Nitride (GaN), High Electron Mobility Transistor (DH-HEMT) 10 is shown having a single-crystal substrate 12, here, for example silicon carbide (SiC), and a series of the following epitaxial grown layers: a Group III-N layer 14, here, for example, an aluminum nitride (AlN) layer 14, on the SiC substrate 12; a semi-insulating Group III-N layer, here, for example, Aluminum Gallium Nitride ($Al_xGa_{(1-x)}N$) layer 19, where, x is in the range of 0.03 to 0.08; a 10- to 50-nm-thick channel layer 20, here undoped, or intrinsic Group III-N, here, for example, GaN including an n-type conductivity portion 22 therein, here a doping spike 22 (sometimes also referred to as delta-doped) of n-type conductivity, here silicon doped spike 22 in the channel layer 20 of Gallium Nitride (GaN), and a 20- to 35-nm-thick Group III-N layer, here, for example, an $Al_yGa_{(1-y)}N$ layer 24, here undoped on the channel layer 20 of GaN, as shown, where y is typically in the range of 0.2 to 0.35. The $Al_yGa_{(1-y)}N$ layer 24 layer serves as a top-barrier polarization-generating layer forming a heterojunction with an upper surface 21 of the channel layer 20 and producing a 2-DEG charge density in the III-N channel layer 20. The AlGaN layer 19 serves as a back-barrier polarization-generating layer forming a heterojunction with a lower surface 23 of the channel layer 20. The silicon doping spike 22 is formed for example by incorporating silicon (Si) during the epitaxial growth and has a doping profile with peak doping concentration in a range of $1 \times 10^{12}/cm^2$ to $2 \times 10^{13}/cm^2$, for example, and a width δ, which may be as small as 1-3 atomic layers (<2 nm). The peak doping concentration is at a predetermined position in the channel layer 20, the position in this example being in a range, R, extending from a predetermined distance, D1, here for example, 5 nm above a lower surface 23 of the III-N channel layer 20 to a predetermined distance, D2, here for example, 5 nm below an upper surface 21 of the III-N channel layer. The doping restores charge lost from the use of a back-barrier and therefore the doping level is a function of the amount of charge that is needed to restore this lost charge.

The DH-HEMT 10 includes, in this example, a 1-nm-thick cap layer 25 of GaN epitaxially grown on layer 24 and a 50 nm thick, for example, passivation layer 26 (here, for example, silicon nitride, or other dielectric layer). Source and drain contacts 28, 30 make ohmic contact with portions of the upper surface of the GaN layer 25, as shown. A gate contact 32, disposed between the source and drain contacts 28, 30, makes Schottky contact with a portion of the upper surface of the GaN layer 25, as shown. The gate electrode 32 controls a flow of carriers between the source electrode 28 and the drain electrode 30 through the n-doped GaN channel layer 20.

The n-doped GaN layer 20 serves as a carrier carrying channel layer. As noted above, the AlGaN layer 24 serves as a top-barrier polarization-generating layer forming a heterojunction with an upper surface 21 of the channel layer 20. As a result, a 2D Electron Gas (2-DEG) region is formed adjacent the top-barrier polarization-generating layer 24/channel layer 20 heterojunction, as indicated.

The doping concentration of the spiked or delta-doped n-type conductivity portion 22 is selected so that the resulting 2-DEG density is approximately the same as a HEMT structure without a back-barrier layer.

Figure 2:
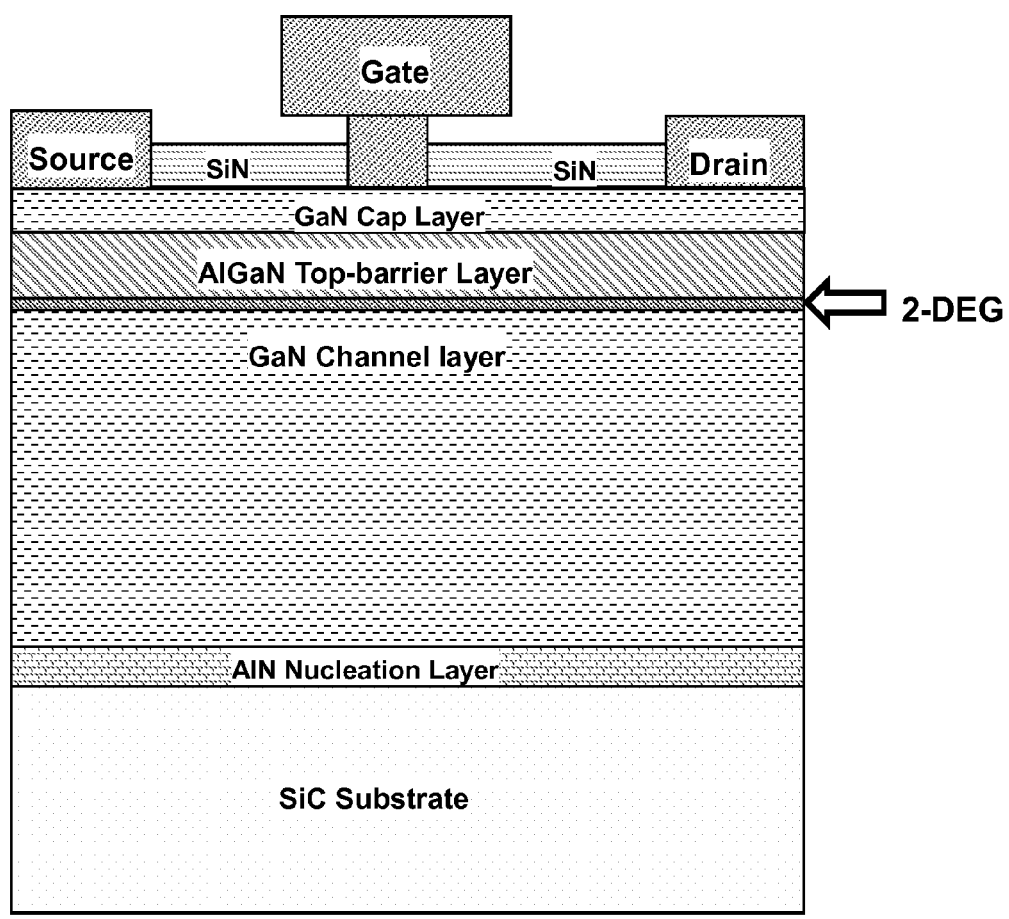
FIG. 2 is a simplified cross-sectional sketch of a heterojunction Gallium Nitride (GaN) High Electron Mobility Transistor (HEMT) without a back-barrier layer according to the PRIOR ART and serves as a baseline for comparison with the DH-HEMT of FIG. 1.
Figure 3:
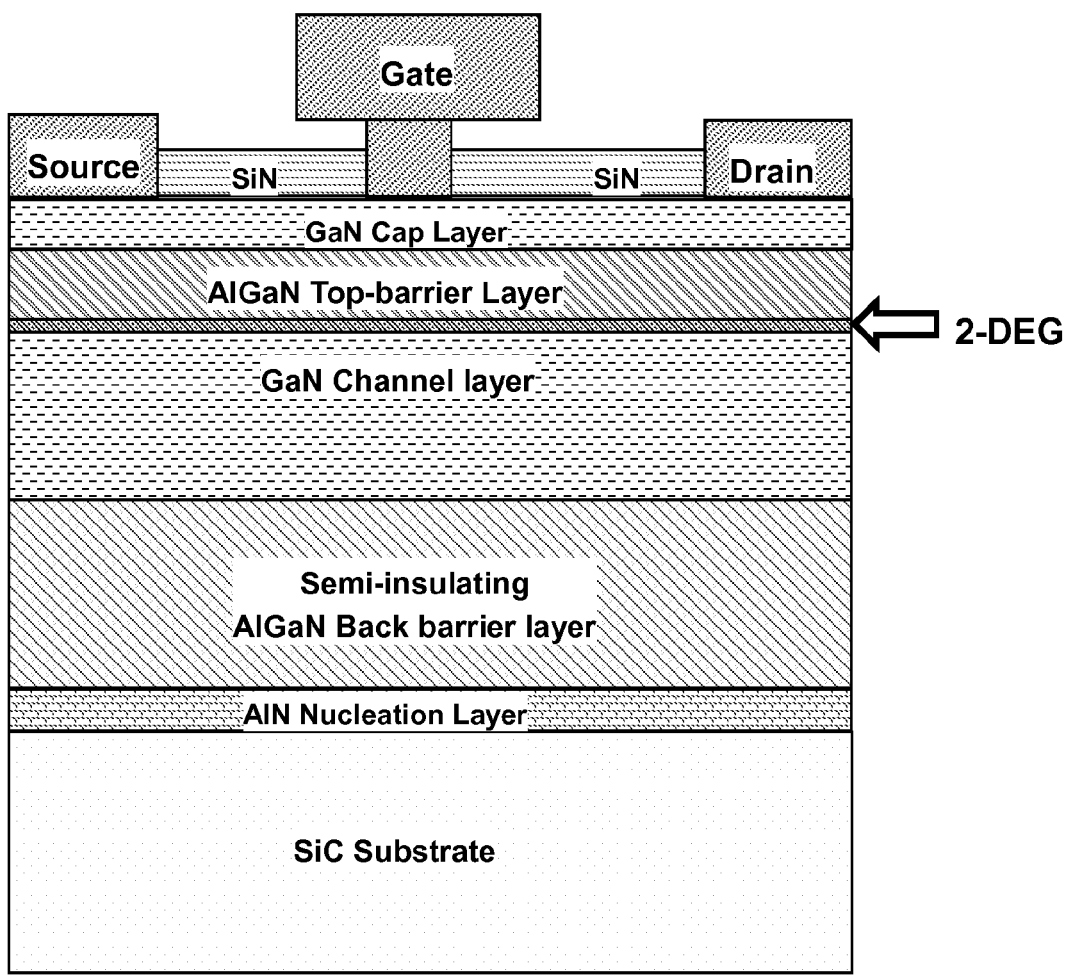
FIG. 3 is a simplified cross-sectional sketch of double heterojunction (DH) Gallium Nitride (GaN) High Electron Mobility Transistor (DH-HEMT) according to the PRIOR ART without a doped channel for comparison with the DH-HEMT of FIG. 1.

The delta-doped structure described above in connection with FIG. 1 was compared experimentally with a 2-DEG charge density "baseline" single heterojunction HEMT structure having an identical top-barrier layer of $Al_yGa_{(1-y)}N$, as shown in FIG. 2 (that is, the thickness and the Al mole concentration in the barrier layer of $Al_yGa_{(1-y)}N$ are the same for both the structure in FIG. 1 and the structure in FIG. 2), and delta-doped structure described above in connection with FIG. 1 was compared experimentally with a 2-DEG charge density conventional DH-HEMT 2-DEG structure (as shown in FIG. 3) having an increased "Al mole fraction", here 2 atomic % increase in Al mole fraction in the top-barrier layer of $Al_yGa_{(1-y)}N$, compared to FIGS. 1 and 2 (that is, the thickness is identical, however the Al mole concentration in the barrier layer of $Al_yGa_{(1-y)}N$ is 2 atomic % increased from that in the structure in FIGS. 1 and 2). Here, in this experiment, the peak doping concentration of the silicon in region 22 was $1.7 \times 10^{12}/cm^2$. The results are shown below:

| Design | Al Mole-Fraction in AlGaN | δ doping ($10^{12}/cm^2$) | δ doping dist. from AlGaN Back-barrier (nm) | Ns ($10^{12}/cm^2$) | ΔNa (%) |
|---|---|---|---|---|---|
| Baseline (FIG. 2) | Y | — | — | 9.08 | — |
| Increased Al Mole-Fraction (FIG. 3) | Y + 0.02 | — | — | 8.67 | −5% |
| Delta-doped (FIG. 1) | Y | 1.7 | 5.0 | 8.70 | −4% |

From the above, it is noted that the charge density (Ns, measured in number of electrons per square centimeter) in the baseline structure of FIG. 2 without a back barrier has a charge density of $9.08 \times 10^{12}/cm^2$. When a back-barrier layer is added, the 2-DEG charge is reduced compared to the baseline structure of FIG. 2. Physics-based computer simulations results showed a 2-DEG charge reduction of 40%. One method to restore the channel charge is to increase the Al mole fraction in the top-barrier layer of $Al_yGa_{(1-y)}N$. The structure in FIG. 3 having the back-barrier has a 2 atomic % increase in Al mole fraction in the top-barrier layer of $Al_yGa_{(1-y)}N$ in order to again have approximately (to within 5%) the same charge density as the baseline structure (FIG. 2). However, the increase in mole fraction introduces unwanted stress in the structure. In accordance with the disclosure, n-type conductivity doping region 22 is added into the channel layer 20. Here, the added dopant is the silicon-doped delta-doped spike 22 (FIG. 1) which again yields approximately (to within 4%) the same charge density as the baseline structure (FIG. 2) and does not therefore require the stress inducing, increased Al mole fraction in the top-barrier layer of $Al_yGa_{(1-y)}N$ as in the structure of FIG. 3. That is, with the delta-doped structure of FIG. 1, the charge reduction because of the back-barrier in the structure of FIG. 3, was recovered and, has a back-barrier providing charge confinement in the gate channel, thereby improving gate control, resulting in lowering off-state conduction and allowing for improved gain performance at higher-voltage operation.

A number of embodiments of the disclosure have been described. Nevertheless, it will be understood that various modifications may be made without departing from the spirit and scope of the disclosure. For example, although demonstrated on a delta-doped device with AlGaN top-barrier and AlGaN back-barrier layers, the disclosure is not specific to delta-doping or the AlGaN material system and can be applicable to a different doping scheme and to a any different binary, ternary or quaternary Group III-N material system, such as, for example AlN, AlInN or AlInGaN. Further, the layer 25 of GaN is an optional layer. Still further, while the doped channel layer has been described above in connection with a Schottky gate contact field effect transistor (FET) it may be used with other devices such as, for example a metal-insulator gate (MIS) field-effect transistor. Accordingly, other embodiments are within the scope of the following claims.

What is claimed is:
1. A semiconductor structure, comprising:
a Group III-N channel layer;
a Group III-N top-barrier polarization-generating layer forming a heterojunction with an upper surface of the channel layer;
a Group III-N back-barrier polarization-generating layer forming a heterojunction with a lower surface of the channel layer;
wherein the Group III-N channel layer has disposed therein a doped region having predetermined n-type conductive dopant; and wherein the doped region is a delta-doped region having a peak doping concentration a predetermined finite distance from the upper surface of the channel layer and a predetermined finite distance from the lower surface of the channel layer.

2. The semiconductor structure recited in claim 1 wherein the peak doping concentration is in a range of $1\times10^{12}/cm^2$ to $2\times10^{13}/cm^2$.

3. The semiconductor structure recited in claim 1 wherein the heterojunction formed with the upper surface of the channel layer produces a 2 Dimensional Electron Gas (2DEG) region in the III-N channel layer and wherein the peak doping concentration of the delta-doped region is at a predetermined position in the channel layer, the position being in a range, R, extending from 5 nanometers above a lower surface of the III-N channel layer to 5 nanometers below an upper surface of the III-N channel layer.

4. The semiconductor structure recited in claim 3 wherein the delta-doped region has a width δ, here is 1-3 atomic layers (<2 nm).

5. The semiconductor structure recited in claim 1 wherein the channel layer is GaN, the top-barrier polarization-generating layer is AlGaN having a mole concentration in a range of 20-35%, and the back-barrier polarization-generating layer is AlGaN having a mole concentration in a range of 3-8%.

6. The semiconductor structure recited in claim 5 wherein the top-barrier polarization-generating layer has a thickness in a range of 15-30 nm and the back-barrier polarization-generating layer has a thickness greater than 20 nm.

7. The semiconductor structure recited in claim 1 wherein the channel layer is n-type doped GaN having a thickness in a range of 10-50 nm.

8. The semiconductor structure recited in claim 7 wherein the top-barrier polarization-generating layer is AlGaN having a mole concentration in a range of 20-35%, and the back-barrier polarization-generating layer is AlGaN having a mole concentration in a range of 3-8%.

9. The semiconductor structure recited in claim 8 wherein the top-barrier polarization-generating layer has a thickness in a range of 15-30 nm and the back-barrier polarization-generating layer has a thickness greater than 20 nm.

10. The semiconductor structure recited in claim 1 including a source electrode over a first surface portion of the structure, a drain electrode over a second surface portion of the structure; and a gate electrode over a third portion of the structure, the gate electrode controlling a flow of carriers between the source electrode and the drain electrode through the channel layer.

11. A semiconductor structure, comprising:
a GaN channel layer having an n-doped region;
a first AlGaN layer forming a heterojunction with an upper surface of the channel layer;
a second AlGaN layer forming a heterojunction with a lower surface of the channel layer; and
wherein the heterojunction formed with the upper surface of the channel layer produces a 2 Dimensional Electron Gas (2DEG) region in the III-N channel layer.

12. The semiconductor structure recited in claim 11 wherein the doped region is a delta-doped region having a peak doping concentration a predetermined distance from the upper surface of the channel layer and the lower surface of the channel layer.

13. The semiconductor structure recited in claim 12 wherein the peak doping concentration is in a range of $1\times10^{12}/cm^2$ to $2\times10^{13}/cm^2$.

14. The semiconductor structure recited in claim 12 wherein the heterojunction formed with the upper surface of the channel layer produces a 2 Dimensional Electron Gas (2DEG) region in the III-N channel layer and wherein the peak doping concentration of the delta-doped region is at a predetermined position in the channel layer, the position being in a range, R, extending from 5 nanometers above a lower surface of the channel layer to 5 nanometers below an upper surface of the channel layer.

15. The semiconductor structure recited in claim 14 wherein the doping spike has width δ, where δ is 1-3 atomic layers (<2 nm).

16. The semiconductor structure recited in claim 11 including a source electrode over a first surface portion of the structure, a drain electrode over a second surface portion of the structure; and a gate electrode over a third portion of the structure, the gate electrode controlling a flow of carriers between the source electrode and the drain electrode through the n-doped GaN channel layer.

17. A semiconductor structure, comprising:
a Group III-N channel layer;
a Group III-N top-barrier polarization-generating layer forming a heterojunction with an upper surface of the channel layer and producing a 2D Electron Gas (2-DEG) region in the Group III-N channel layer;
a Group III-N back-barrier polarization-generating layer forming a heterojunction with a lower surface of the channel layer, the back-barrier polarization-generating layer reducing charge density in the 2D Electron Gas (2-DEG) region in the Group III-N channel layer;
wherein the Group III-N channel layer has disposed therein a doped region having a predetermined amount of n-type conductive dopant, the predetermined amount of n-type conductive dopant being selected to replace the charge density reduced in the 2D Electron Gas (2-DEG) region.

18. A method for forming a semiconductor structure having: a Group III-N channel layer; a Group III-N top-barrier polarization-generating layer forming a heterojunction with an upper surface of the channel layer and producing a 2D Electron Gas (2-DEG) region in the Group III-N channel layer; and a Group III-N back-barrier polarization-generating layer forming a heterojunction with a lower surface of the channel layer, the back-barrier polarization-generating layer reducing charge density in the 2D Electron Gas (2-DEG) region, the method comprising:
providing a predetermined amount of n-type conductivity dopant in the Group III-N channel layer, the predetermined amount of introduced n-type conductivity dopant provided being related to the reduced charge density in the 2D Electron Gas (2-DEG) region channel.

19. The method recited in claim 18 wherein the doped region is a delta-doped region having a peak doping concentration at a predetermined distance from the upper surface of the channel layer and the lower surface of the channel layer.

20. The method recited in claim 18 including determining amount of charge density reduced by the back-barrier polarization-generating layer and using the determined amount of charge density reduced by the back-barrier polarization-generating layer to determine the predetermined amount of n-type conductivity dopant provided in the Group III-N channel layer.

21. The method recited in claim 20 wherein the doped region is a delta-doped region having a peak doping concentration at a predetermined distance from the upper surface of the channel layer and the lower surface of the channel layer.

22. The structure recited in claim 1 wherein the heterojunction formed with the upper surface of the channel layer produces a 2 Dimensional Electron Gas (2DEG) region in the III-N channel layer.

23. A method for forming a semiconductor structure having: a Group III-N channel layer; a Group III-N top-barrier polarization-generating layer forming a heterojunction with an upper surface of the channel layer and producing a 2D Electron Gas (2-DEG) region in the Group III-N channel layer; and a Group III-N back-barrier polarization-generating layer forming a heterojunction with a lower surface of the channel layer, the back-barrier polarization-generating layer reducing charge density in the 2D Electron Gas (2-DEG) region, the method comprising:

providing a predetermined amount of n-type conductivity dopant in the Group III-N channel layer, the predetermined amount of introduced n-type conductivity dopant being selected to compensate for the reduced charge density in the 2D Electron Gas (2-DEG) region channel.

24. The method recited in claim 23 wherein the doped region is a delta-doped region having a peak doping concentration a predetermined distance from the upper surface of the channel layer and the lower surface of the channel layer.

25. The method recited in claim 23 including determining amount of charge density reduced by the back-barrier polarization-generating layer and using the determined amount of charge density reduced by the back-barrier polarization-generating layer to determine the predetermined amount of n-type conductivity dopant provided in the Group III-N channel layer.

26. The method recited in claim 25 wherein the doped region is a delta-doped region having a peak doping concentration a predetermined distance from the upper surface of the channel layer and the lower surface of the channel layer.

27. A method for forming a semiconductor structure having: a Group III-N channel layer; a Group III-N top-barrier polarization-generating layer forming a heterojunction with an upper surface of the channel layer and producing a 2D Electron Gas (2-DEG) region in the Group III-N channel layer; and a Group III-N back-barrier polarization-generating layer forming a heterojunction with a lower surface of the channel layer, the back-barrier polarization-generating layer reducing charge density in the 2D Electron Gas (2-DEG) region, the method comprising:

determining the amount of reduced charge density in the 2D Electron Gas (2-DEG) region; and providing a predetermined amount of n-type conductivity dopant in the Group III-N channel layer, the predetermined amount of introduced n-type conductivity dopant provided being related to the determined amount of reduced charge density in the 2D Electron Gas (2-DEG) region channel.

* * * * *